(12) United States Patent
Prandi et al.

(10) Patent No.: US 7,986,182 B2
(45) Date of Patent: Jul. 26, 2011

(54) FULLY DIFFERENTIAL DEMODULATOR WITH VARIABLE GAIN, AND METHOD FOR DEMODULATING A SIGNAL

(75) Inventors: Luciano Prandi, Bellinzago Novarese (IT); Carlo Caminada, Rho (IT); Paolo Invernizzi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 14 days.

(21) Appl. No.: 12/651,882

(22) Filed: Jan. 4, 2010

(65) Prior Publication Data
US 2010/0132490 A1 Jun. 3, 2010

Related U.S. Application Data

(63) Continuation of application No. 12/032,481, filed on Feb. 15, 2008, now Pat. No. 7,663,432.

(30) Foreign Application Priority Data

Feb. 15, 2007 (EP) ..................................... 07425081

(51) Int. Cl.
*G01C 19/00* (2006.01)
*H03D 1/00* (2006.01)

(52) U.S. Cl. ..................................... 329/347; 73/504.02
(58) Field of Classification Search .................. 329/347; 327/50; 73/488, 503.3, 504.02, 504.03, 504.04, 73/504.12, 514.18
See application file for complete search history.

(56) References Cited

U.S. PATENT DOCUMENTS

| | | | |
|---|---|---|---|
| 4,789,837 A | 12/1988 | Ridgers | |
| 5,734,683 A | 3/1998 | Hulkko et al. | |
| 7,275,433 B2 | 10/2007 | Caminada et al. | |
| 7,663,432 B2 * | 2/2010 | Prandi et al. .................. | 329/347 |

FOREIGN PATENT DOCUMENTS

| | | |
|---|---|---|
| EP | 0132885 A1 | 2/1985 |
| EP | 0209948 A1 | 1/1987 |

* cited by examiner

*Primary Examiner* — David Mis
(74) *Attorney, Agent, or Firm* — Lisa K. Jorgenson; E. Russell Tarleton; Seed IP Law Group PLLC

(57) ABSTRACT

A demodulator is provided for demodulating an amplitude-modulated input signal defined by a carrier signal having a carrier frequency modulated by a modulating signal, the demodulator including an amplifier stage having a gain and structured to receive the amplitude-modulated input signal, and a gain control stage coupled to the amplifier stage and configured to vary the gain of the amplifier stage according to the carrier frequency of the carrier signal.

26 Claims, 6 Drawing Sheets

FULLY DIFFERENTIAL DEMODULATOR WITH VARIABLE GAIN, AND METHOD FOR DEMODULATING A SIGNAL

BACKGROUND

1. Technical Field

The present disclosure relates to a fully differential demodulator with variable gain and to a method for demodulating a signal.

2. Description of the Related Art

As is known, demodulators find an extremely wide range of applications in numerous sectors of electronics and telecommunications. Just to provide an example, in addition to the well-known uses for transmission and reception of electromagnetic signals, demodulators are used in read chains of microelectromechanical gyroscopes. In these devices, a first movable mass is set in oscillation along an axis at a predetermined frequency and draws in the oscillatory motion a second mass, which is constrained to the first mass so as to have one relative degree of freedom. When the gyroscope undergoes a rotation about a given axis at an angular velocity, the second mass is subjected to a Coriolis force as a result of the drawing action and moves according to the relative degree of freedom. The displacement of the second mass can be detected and transduced into electrical signals amplitude-modulated in a way proportional to the angular velocity, with a carrier at the oscillation frequency of the first mass. The use of a demodulator enables the modulating signal to be obtained and hence tracing back to the instantaneous angular velocity.

Known demodulators perform a multiplication between the modulated signal and the carrier signal in order to bring the modulating signal back into baseband. They are rather complex devices that require the use of various operational amplifiers, filters and sophisticated synchronization circuits. In particular, discrete-time analog demodulators are frequently particularly complex because driving thereof requires a large number of timing signals appropriately synchronized with the carrier frequency. Consequently, not only is design difficult, but also the practical implementation can pose serious problems. For this reason, currently available demodulators, especially discrete-time analog demodulators, are not suitable for use in applications that, like microelectromechanical gyroscopes, call for extremely low levels of consumption and small overall dimensions.

BRIEF SUMMARY

The present disclosure provides a demodulator and a method of demodulation that overcome the drawbacks outlined above.

According to the present disclosure, a demodulator and a method for demodulating a signal are provided.

In accordance with the present disclosure, a demodulator for an amplitude-modulated input signal defined by a carrier signal having a carrier frequency modulated by a modulating signal is provided. The demodulator includes an amplifier stage having a gain and structured to receive the amplitude-modulated input signal; and a gain-control stage coupled to the amplifier stage and configured to vary the gain of the amplifier stage according to the carrier frequency of the carrier signal.

In accordance with another aspect of the present disclosure, the gain control stage is coupled to at least one controllable capacitive network for modifying a variable capacitance with a periodic signal equal to the carrier frequency.

In accordance with the present disclosure, a method for demodulating a signal is provided, the method including receiving an amplitude-modulated input signal, defined by a carrier signal at a carrier frequency and a modulating signal; and amplifying the input signal with a gain that is varied according to the carrier frequency of the carrier signal.

In accordance with the present disclosure, a circuit is provided that includes a variable gain amplifier stage adapted to receive an amplitude modulated signal and to generate an output signal having a gain; and a gain control stage coupled to the variable gain amplifier stage, the gain control stage adapted to receive as input a carrier signal of the amplitude modulated signal and to generate a gain control signal to control the gain of the variable gain amplifier stage in response to a frequency of the carrier signal and to bring the amplitude modulated signal into a baseband in the output signal.

In accordance with the present disclosure, a gyroscopic apparatus is provided that includes a gyroscope device generating a modulated signal, the gyroscope device comprising two microstructure movable masses and a read interface, the modulated signal comprising a discrete-time analog voltage given by a product of a modulating signal and a carrier signal having a carrier frequency, the carrier frequency comprising a mechanical resonance frequency of the two movable masses and an amplitude modulation that is proportional to an angular velocity of the gyroscope device; and a demodulator of the discrete-time analog type, the demodulator comprising: a variable gain amplifier stage adapted to receive an amplitude modulated signal and to generate an output signal having a gain; and a gain control stage coupled to the variable gain amplifier stage, the gain control stage adapted to receive as input a carrier signal of the amplitude modulated signal and to generate a gain control signal to control the gain of the variable gain amplifier stage in response to a frequency of the carrier signal and to bring the amplitude modulated signal into a baseband in the output signal.

BRIEF DESCRIPTION OF THE SEVERAL VIEWS OF THE DRAWINGS

For a better understanding of the disclosure, some embodiments thereof are now described, purely by way of a non-limiting example and with reference to the attached drawings, wherein.

DETAILED DESCRIPTION

Figure 1:
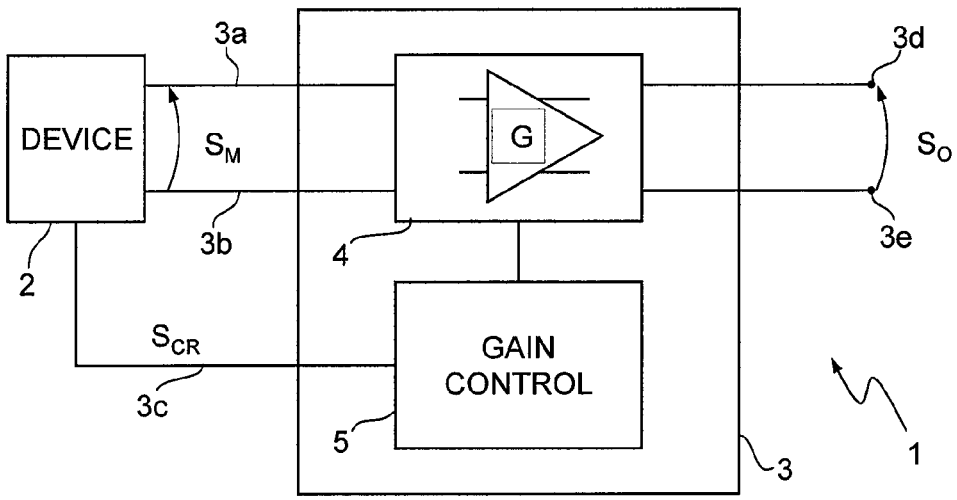
FIG. 1 is a simplified block diagram of an electronic apparatus incorporating a demodulator according to a first embodiment of the present disclosure.

FIG. 1 is a schematic illustration of an electronic apparatus 1 comprising a device 2, which generates a modulated signal $S_M$, and a demodulator 3 coupled to the device 2 for demodulating the modulated signal $S_M$ and generating a corresponding output signal $S_O$ in baseband. The modulated signal $S_M$ is given by the product of a modulating signal $S_M'$ (not illustrated) and a carrier signal $S_{CR}$ having a carrier frequency $f_{CR}$:

$$S_M = S_M' S_{CR} = S_M' \sin 2\pi f_{CR} t \quad (1)$$

In one embodiment, in which the electronic apparatus 1 is a microelectromechanical gyroscope, the device 2 is a microstructure, in itself known and not shown in detail, having two movable masses (one for driving and one for detection) and provided with a read interface. The modulated signal $S_M$ detected by the read interface is in this case a discrete-time analog voltage. The carrier frequency is a mechanical resonance frequency of the microstructure, and the amplitude modulation is proportional to an angular velocity of the gyroscope.

The demodulator 3 is of a discrete-time analog type and is based upon the use of switched-capacitor circuits. Signal inputs 3a, 3b of the demodulator 3 are connected to outputs of the device 2 for receiving the modulated signal $S_M$. A further output of the device 2 supplies the carrier signal $S_{CR}$ to a demodulation input 3c of the demodulator 3. The output signal $S_O$ is supplied on outputs 3d, 3e of the demodulator 3.

The demodulator 3 has a variable-gain amplifier stage 4 and a control stage 5 for controlling the gain G of the amplifier stage 4.

In the embodiment of the disclosure described herein, the amplifier stage 4 is of a fully differential switched-capacitor type. Inputs of the amplifier stage 4 are coupled to the signal inputs 3a, 3b for receiving the modulated signal $S_M$.

Figure 2:
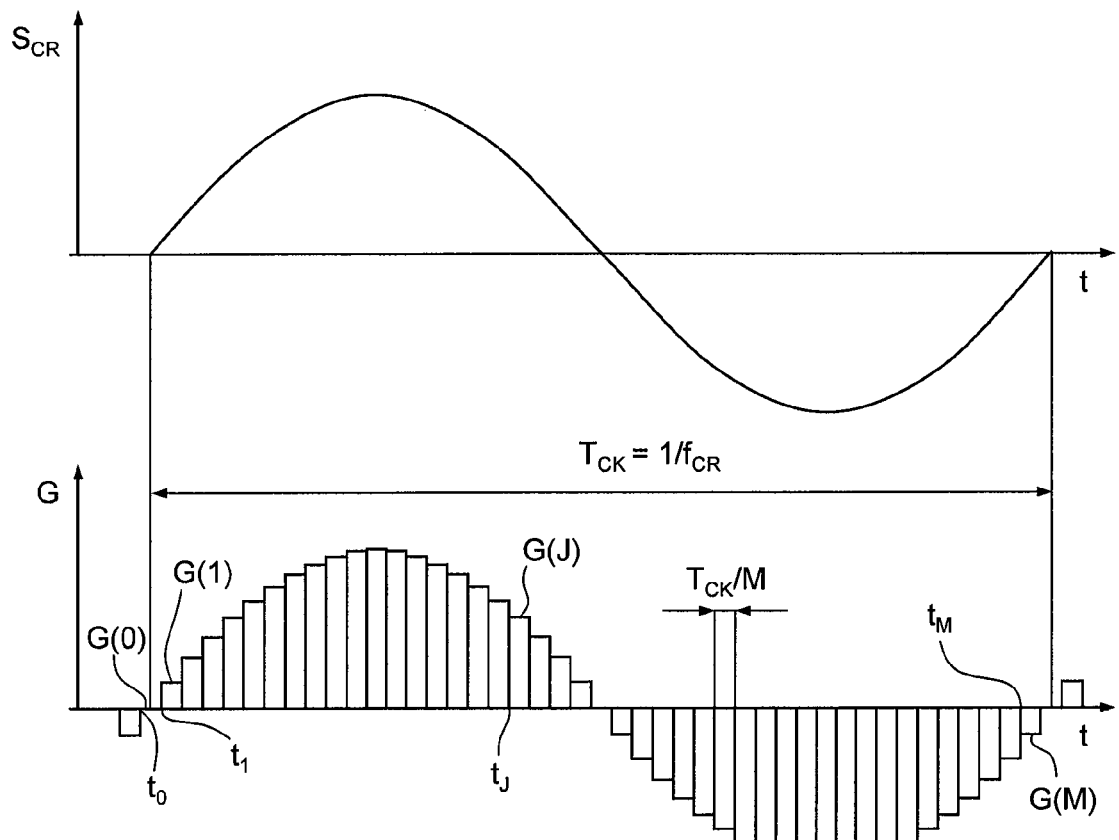
FIG. 2 shows graphs that illustrate quantities regarding the demodulator of FIG. 1.

The control stage 5 receives from the device 2 the carrier signal $S_{CR}$ and uses it for varying the gain G of the amplifier stage 4 according to a zero-mean discrete sinusoid, at the carrier frequency $f_{CR}$ and synchronous with the carrier signal $S_{CR}$ itself, as shown in FIG. 2.

The gain G is used as a demodulating quantity. The output signal $S_O$, in fact, is proportional both to the modulated signal $S_M$ and to the gain G of the amplifier stage 4, which, by the action of the control stage 5, is a sinusoid at the carrier frequency $f_{CR}$. In practice, the processing of the modulated signal $S_M$ performed by the demodulator 3 is equivalent to a multiplication by the carrier signal $S_{CR}$, and hence the resulting signal, i.e., the output signal $S_O$, is brought back into baseband.

Figure 3:
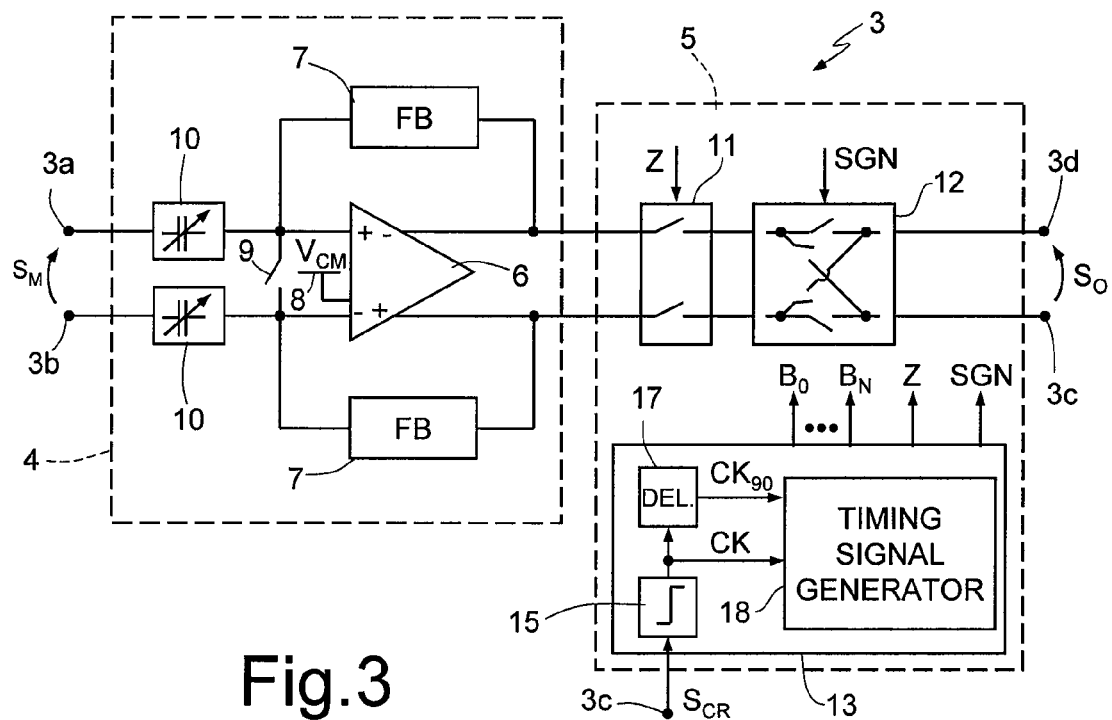
FIG. 3 is a simplified circuit diagram of the demodulator of FIG. 1.

FIG. 3 illustrates in greater detail the demodulator 3. The amplifier stage 4 comprises an operational amplifier 6, with negative feedback obtained by two capacitive-type feedback networks 7, and controllable capacitive input networks 10. Each feedback network 7 is connected between a respective input and a respective output of the operational amplifier 6, between which an inverting action is exerted. Both of the feedback networks 7 have a feedback capacitance $C_{FB}$. The operational amplifier 6 moreover uses a common-mode line 8, supplying a common-mode voltage $V_{CM}$. A reset switch 9 is set between the inputs of the operational amplifier 6.

The controllable capacitive networks 10 are connected each between a respective signal input 3a, 3b of the demodulator 3 and a respective input of the operational amplifier 6. In addition, the controllable capacitive networks 10 have an equal variable capacitance $C_V$, which can assume in sequence a plurality of discrete values, as explained in greater detail hereinafter, and are controlled by the synchronization device 13 through of a plurality of timing signals $B_0$-$B_N$. The modulus of the gain G of the operational amplifier 6 is equal to $C_V/C_{FB}$.

The control stage 5 comprises a zero circuit 11, a sign-inverting circuit 12 and a synchronization device 13.

Figure 4A:
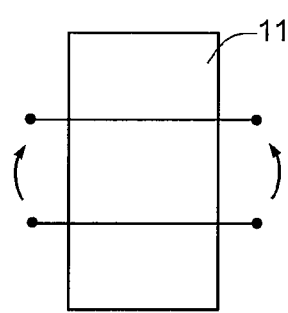
FIGS. 4a and 4b show a first portion of the demodulator of FIG. 1 in respective different operating configurations.
Figure 4B:
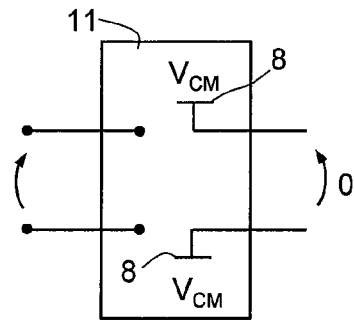
Figure 5A:
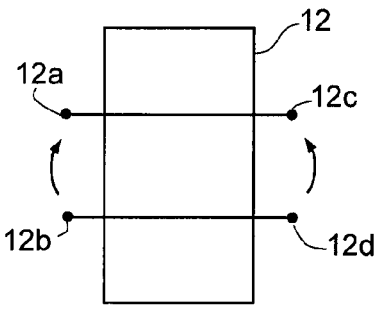
FIGS. 5a and 5b show a second portion of the demodulator of FIG. 1 in respective different operating configurations.
Figure 5B:
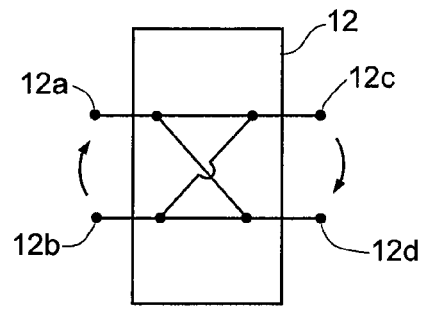

The zero circuit 11 and the sign-inverting circuit 12 are cascaded between the operational amplifier 6 and the outputs 3d, 3e of the demodulator 3. Both are controlled by the synchronization device 13, respectively, through a zero signal Z and a sign-inversion signal SGN, and have two respective operating configurations. In particular, in a first operating configuration (FIG. 4a) the inputs of the zero circuit 11 are directly connected to respective outputs in such a way that incoming signals can transit unaltered. In a second operating configuration (FIG. 4b), the outputs are decoupled from the inputs and are connected to the common-mode line 8. In this way, a zero signal is supplied at output, irrespective of the signal present at input. As shown in FIG. 5a, the sign-inverting circuit 12 has a first input 12a, a second input 12b, a first output 12c, and a second output 12d. In the first operating configuration of the sign-inverting circuit 12, the first input 12a and the second input 12b are connected to the first output 12c and to the second output 12d, respectively. The incoming signals can thus pass without being modified. In the second operating configuration (FIG. 5b), instead, the first input 12a and the second input 12b are connected to the second output 12d and to the first output 12c, respectively. In practice, the connections between the inputs and the outputs of the sign-inverting circuit 12 are inverted, and consequently the output signals have the same amplitude, but opposite sign with respect to the incoming signals.

The synchronization device 13 comprises a comparator 15, a delay block 17, and a timing signal generator 18.

Figure 6:
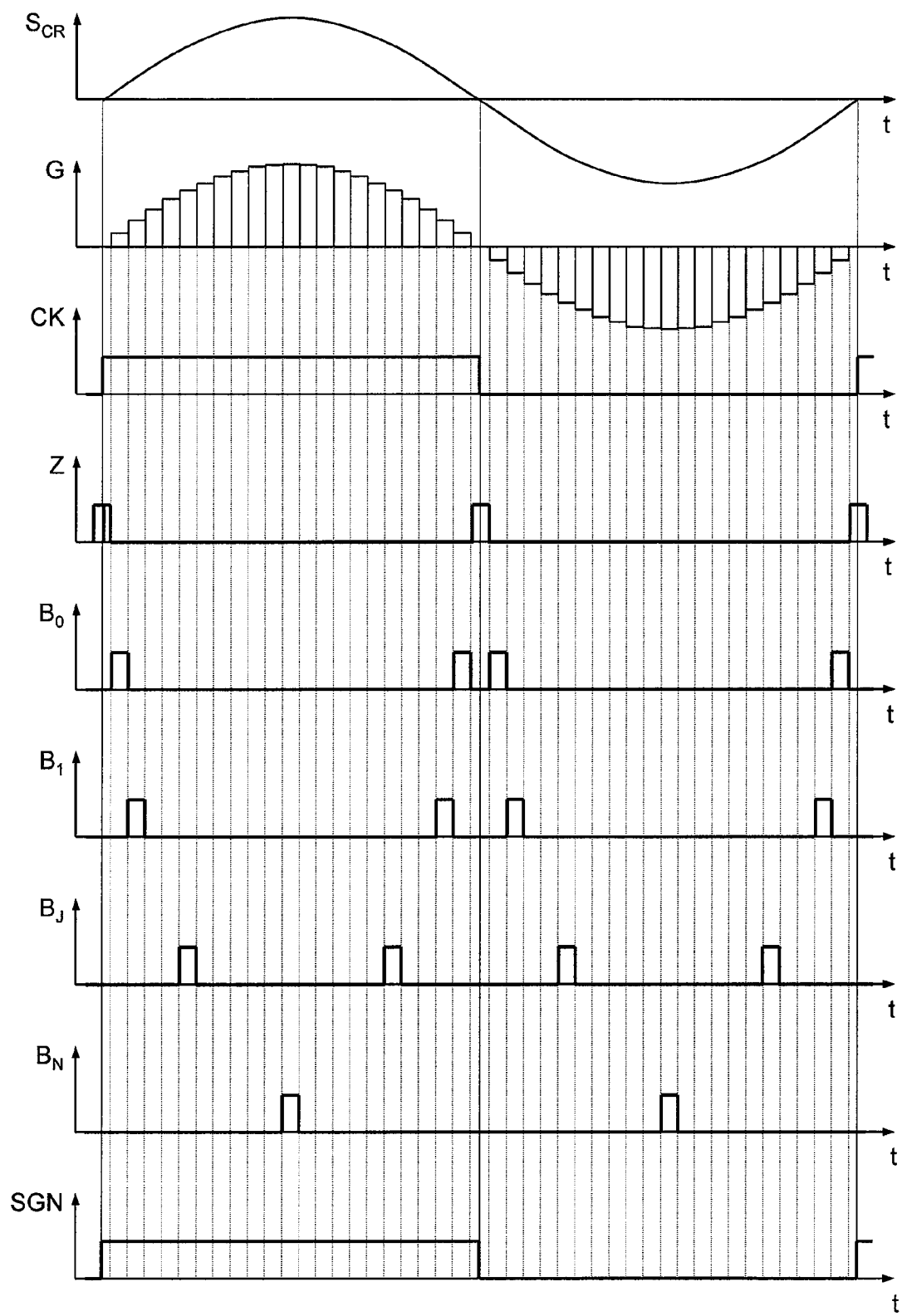
FIG. 6 shows graphs that illustrate quantities regarding the demodulator of FIG. 1.

The comparator 15 receives at input the carrier signal $S_{CR}$ and generates at output a binary timing signal CK, which switches at each half-period of the carrier signal $S_{CR}$ (in practice, at instants of zero-crossing thereof, FIG. 6). The timing signal CK is hence synchronous with the carrier signal $S_{CR}$, and its period $T_{CK}$ is equal to $1/f_{CR}$.

The delay block 17 receives the timing signal CK and generates a delayed timing signal $CK_{90}$, 90° out of phase, which is used to obtain possible quadrature components superimposed on the modulated signal $S_M$.

The timing signal generator 18, for example a logic unit, receives the timing signal CK and the delayed timing signal $CK_{90}$ and generates the timing signals $B_0$-$B_N$ so as to modify the gain G of the amplifier stage 4 an integer number M of times for each period $T_{CK}$, synchronously with the timing signal CK (i.e., M control cycles of the gain G are carried out for each period $T_{CK}$ of the timing signal CK, FIGS. 2 and 6; the control cycles of the gain G hence have a period equal to $T_{CK}/M$). In addition, the timing signal generator 18 supplies the zero signal Z, the sign-inversion signal SGN, a reset signal RES, and a sampling-control signal CDS, which are respectively supplied to the zero circuit 11, to the sign-inverting circuit 12, to the reset switch 9, and to the feedback networks 7. The timing signals $B_0$-$B_N$ and the zero signal Z are generated by the timing signal generator 18 using an internal counter (known and not shown herein), whereas switching of the sign-inversion signal SGN is caused directly by the variations of the timing signal CK.

During operation of the demodulator 3, the timing signals $B_0$-$B_N$ are applied to the controllable capacitive networks 10 for selecting, at each control cycle of the gain G, values of the variable capacitance $C_V$ according to a sinusoid of frequency equal to the carrier frequency $f_{CR}$. The values of the variable capacitance $C_V$ selected in each control cycle of the gain G are given by:

$$C_V(J) = C_{FB} \sin(2\pi t_J / T_{CK}) \quad (2)$$

where $t_J$ is the initial instant of the generic J-th control cycle of the gain G (see also FIG. 2). The zero circuit 11 is normally in the first operating configuration (FIG. 4a) and is brought into the second operating configuration (FIG. 4b) by the zero signal Z for the duration of one control cycle of the gain G at each half-period of the timing signal CK. In these conditions, the zero circuit 11 prevents the transmission of signals and sets the gain G to zero. As a result of the sign-inversion signal SGN, moreover, the sign-inverting circuit 12 switches between its first and second operating configurations (FIGS. 5a and 5b, respectively) at each half-period of the timing signal CK, in effect changing the sign of the gain G. Consequently, in the generic J-th control cycle of the gain G, the gain G is given by $$G(J)=C_V(J)/C_{FB}=\sin(2\pi t_J/T_{CK})=\sin(2\pi f_{CR} t_J) \quad (3)$$

since the timing signal CK is synchronous with the carrier signal $S_{CR}$ ($T_{CK}=1/f_{CR}$).

The output signal $S_O$ is the product of the gain G of the amplifier stage 4 and the modulated signal $S_M$ $$S_O=S_M G(J_J)=S_M' S_{CR} G(J)=S_M' \sin^2(2\pi f_{CR} t_J) \quad (4)$$

As previously mentioned, then, the gain G is used as demodulating quantity for the modulated signal $S_M$, which already contains the carrier signal $S_{CR}$, and the output signal $S_O$ is brought back into the baseband.

Figure 7:
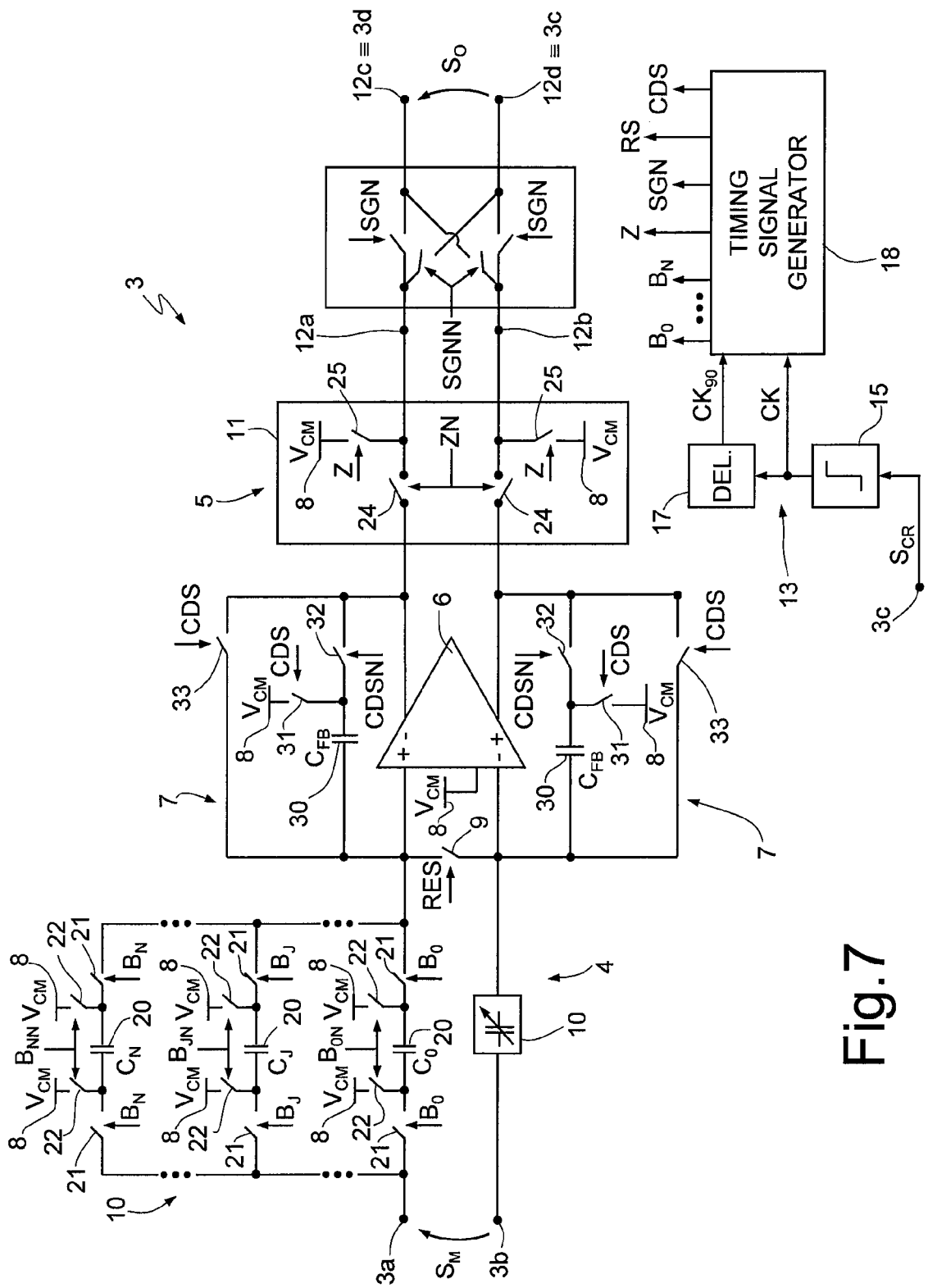
FIG. 7 is a more detailed circuit diagram of the demodulator of FIG. 1.

A detailed diagram of the demodulator 3 is illustrated in FIG. 7.

The controllable capacitive networks 10 each comprise a plurality of respective control capacitors 20, which can be selectively connected between the signal inputs 3a, 3b of the demodulator 3 and the inputs of the operational amplifier 6. Each control capacitor 20 is provided with two enable switches 21, simultaneously controlled by a respective timing signal $B_0$-$B_N$ and arranged one upstream and one downstream of the control capacitor 20 itself. In addition, the terminals of each control capacitor 20 are selectively connectable to the common-mode line 8 through two wait switches 22, which are controlled in phase opposition with respect to the enable switches 21 by corresponding inverted timing signals $B_{0N}$-$B_{NN}$.

The inverted timing signals $B_{0N}$-$B_{NN}$ can be supplied directly by the generator of timing signals 18, or else can be derived from the corresponding timing signals $B_0$-$B_N$ using conventional logic inverters (not shown herein). In the embodiment described herein, the control capacitors 20 have respective capacitances $C_0$-$C_N$ defined by Eq. (2), where J=0, 1, . . . , N, and the timing signals $B_0$-$B_N$ are configured to select in sequence a single control capacitor 20 for each control cycle of the gain G of the amplifier stage 4.

With reference also to FIG. 6, after the zero signal Z has brought the zero circuit 11 into its first operating configuration (FIG. 4a), the control capacitor 20 having lowest capacitance $C_0$ is inserted, while all the others are connected with both terminals to the common-mode line 8. In the subsequent control cycles of the gain G, control capacitors 20 with always increasing capacitance $C_J$ are inserted selectively and in sequence, until the carrier signal $S_{CR}$ reaches the peak value and the control capacitor 20 of maximum capacitance $C_N$ is inserted (first quarter of period). Then, the control capacitors 20 are again inserted in reverse order (i.e., in decreasing order of capacitance) until the carrier signal $S_{CR}$ is set to zero. In this way, in practice, each control capacitor 20 is used four times for each cycle of the timing signal CK (the control capacitor 20 with maximum capacitance $C_N$ is used twice).

With reference once again to FIG. 7, the zero circuit 11 comprises two enable switches 24, each connected between a respective input and a respective output and controlled simultaneously by means of a negated zero signal ZN. In addition, the outputs of the zero circuit 11 are selectively connectable to the common-mode line 8 through respective zero switches 25, controlled simultaneously by the zero signal Z. In the first operating configuration, the enable switches 24 are closed, in such a way that the inputs and the respective outputs of the zero circuit 11 are connected directly. The zero switches 25 are instead open. Instead, in the second operating configuration, the enable switches 24 are open, and the zero switches 25 are closed. The signal supplied by the zero circuit 11 is hence zero, given that both of its outputs are at the common-mode voltage $V_{CM}$.

The sign-inverting circuit 12 comprises two forward-connection switches 27 and two reverse-connection switches 28, respectively controlled by the sign-inversion signal SGN and by a negated sign-inversion signal SGNN. The forward-connection switches 27 are connected one between the first input 12a and the first output 12c and the other between the second input 12b and the second output 12d of the sign-inverting circuit 12 (in the embodiment described herein, the outputs 12c, 12d of the sign-inverting circuit 12 coincide with the outputs 3d, 3e of the demodulator 3). The reverse-connection switches 28 are, instead, connected one between the first input 12a and the second output 12d and the other between the second input 12b and the first output 12c of the sign-inverting circuit 12. In practice, the forward-connection switches 27 and the reverse-connection switches 28 are controlled in phase opposition for inverting the connections between the inputs 12a, 12b and the outputs 12c, 12d of the sign-inverting circuit 12 during passage from the first to the second operating configuration (illustrated in FIGS. 5a and 5b).

Each of the feedback networks 7 comprises a feedback capacitor 30, having the feedback capacitance $C_{FB}$. First terminals of the feedback capacitors 30 are connected to respective inputs of the operational amplifier 6. First offset-sampling switches 31 and feedback switches 32, controlled in phase opposition through the sampling-control signal CDS and, respectively, a negated sampling-control signal CDSN, enable connection of second terminals of the feedback capacitors 30 alternately to the common-mode line 8 and to respective outputs of the operational amplifier 6. Each feedback network 7 further comprises a second offset-sampling switch 33, connected between the respective input and the respective output of the operational amplifier 6. The second offset-sampling switches are controlled by the sampling-control signal CDS.

The reset switch 9 fixes the terminals of the operational amplifier 6 to the common-mode voltage, in such a way that the operational amplifier 6 itself will work in the linear area. The first and second offset-sampling switches 31, 33 and the feedback switches 32 are controlled so as to implement the correlated double sampling (CDS) technique at each interval of control of the gain G of the amplifier stage 4. In order to balance all the nodes of the operational amplifier 6 to the common-mode voltage $V_{CM}$, in a first step, the reset switch 9 and the first and second offset-sampling switches 31, 33 are closed, while the feedback switches 32 are open. Next, the reset switch 9 is opened, so that only the signal contribution due to offset of the operational amplifier 6 and to flicker noise is stored in the feedback capacitors 30. Finally, the first and second offset-sampling switches 31, 33 are opened, and, after a brief decoupling interval, the feedback switches 32 are closed to enable amplification of the entire signal supplied to the operational amplifier 6. However, the contribution of the offset and of the flicker noise, previously stored in the feedback capacitors 30, is now subtracted, and hence only the useful signal is supplied on the outputs of the operational amplifier 6.

The disclosed circuit advantageously enables demodulators of a simple structure, with reduced occupation of area, and with low levels of consumption to be obtained. The demodulator according to the disclosure requires, in fact, just one operational amplifier and, since the demodulation is obtained by varying the gain of the amplification stage, no further circuits such as multipliers are necessary. In addition, the control capacitors can be used four times for each cycle of the carrier signal $S_{CR}$ and of the timing signal CK. Consequently, M/4 control capacitors and (M/4)+3 timing signals are sufficient for demodulation. The overall dimensions due to the control capacitors is hence contained, and also the synchronization and driving operations can be performed in a simple way. The demodulator according to the disclosure is particularly suitable for being implemented by means of (discrete-time analog) switched-capacitor circuits.

Figure 8:
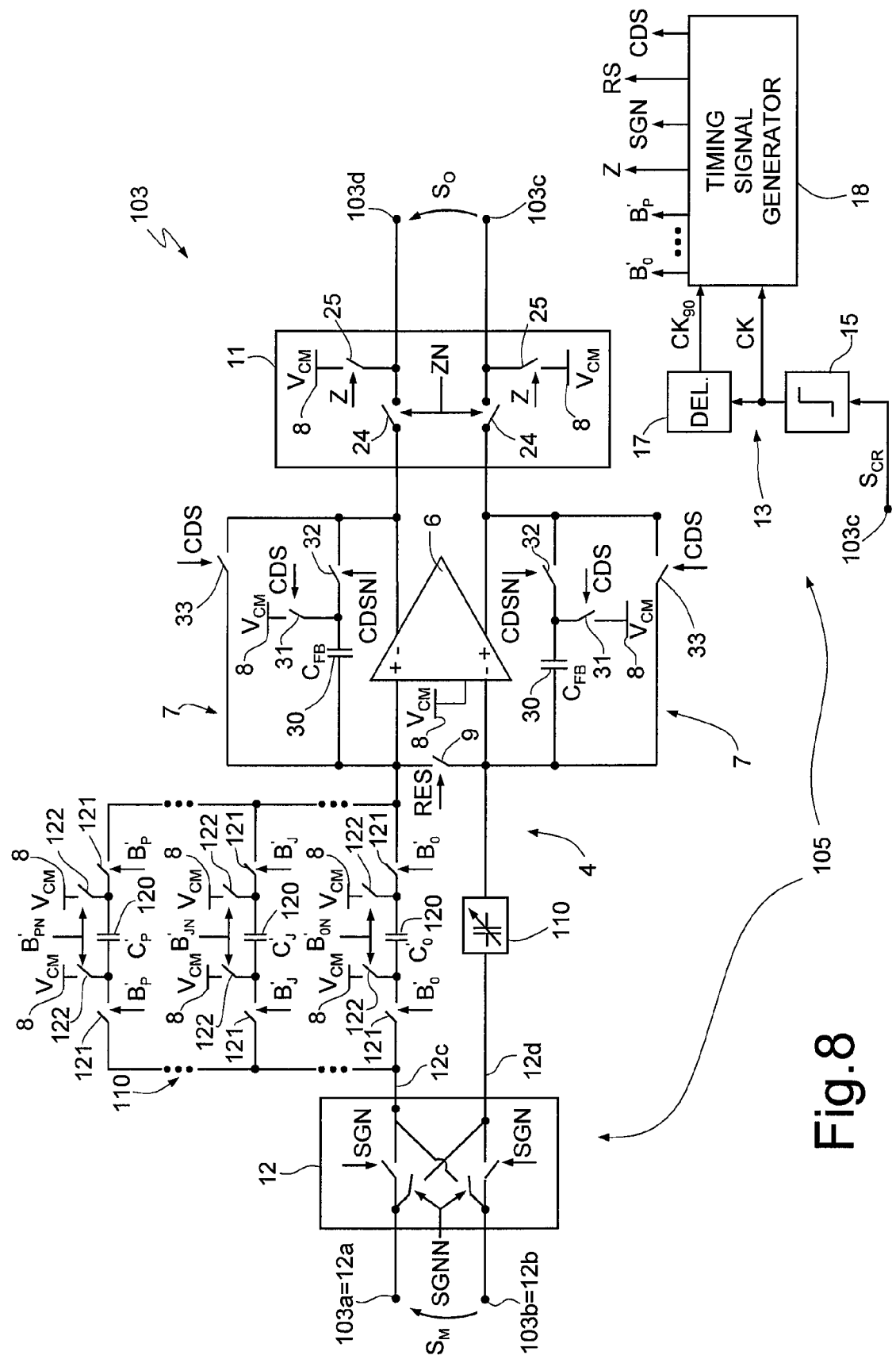
FIG. 8 is a simplified circuit diagram of a demodulator according to a second embodiment of the present disclosure.

A second embodiment is illustrated in FIG. 8, where parts that are the same as those already shown are designated by the same reference numbers.

In this case, a demodulator 103 comprises the amplifier stage 4, with the operational amplifier 8, the feedback networks 7 and controllable capacitive networks 110, and a control stage 105, which includes the zero circuit 11, the sign-inverting circuit 12, and the synchronization device 13. In this case, the sign-inverting circuit 12 is set between the inputs 103a, 103b of the demodulator 103 and the controllable capacitive networks 110, albeit having the same structure and operating in the same way already described with reference in particular to FIGS. 3, 5a, 5b and 7.

The controllable capacitive networks 110 are each connected between a respective output of the sign-inverting circuit 12 and a respective input of the operational amplifier 6 and are controlled by the synchronization device 13 in such a way that their variable capacitance $C_V$ assumes a plurality of values according to a zero-mean discrete sinusoid and to the carrier frequency $f_{CR}$, as indicated by Eq. (2).

Figure 9:
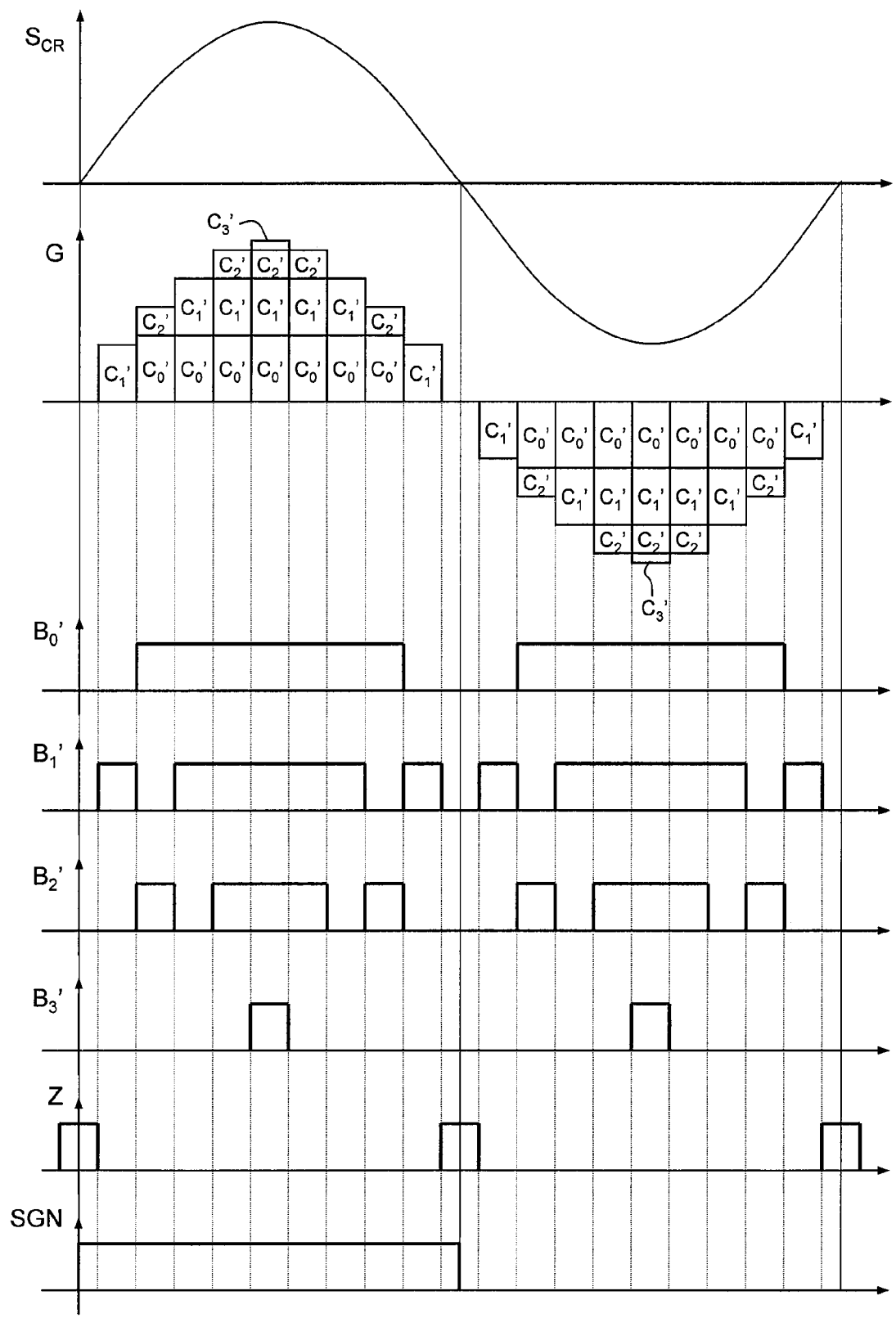
FIG. 9 shows graphs that illustrate quantities regarding the demodulator of FIG. 8.

The controllable capacitive networks 110 each comprise a plurality of respective control capacitors 120, selectively connectable between the sign-inverting circuit 12 and respective inputs of the operational amplifier 6. Each control capacitor 120 is equipped with two enable switches 121, controlled simultaneously by a respective timing signal $B_0'$-$B_P'$ and set one upstream and one downstream of the control capacitor 20 itself. In addition, the terminals of each control capacitor 120 are selectively connectable to the common-mode line 8 through two wait switches 122, which are controlled in phase opposition with respect to the enable switches 121 by means of corresponding negated timing signals $B_{ON}'$-$B_{PN}'$. In the embodiment described here, in particular, the timing signals $B_0'$-$B_P'$ and the negated timing signals $B_{ON}'$-$B_{PN}'$ are configured so as to select, in different cycles of control of the gain G, just one control capacitor 120 or else a number of control capacitors 120 in parallel in each controllable capacitive network 110. In this way, it is possible to reduce both the number of control capacitors 120 necessary and their capacitances, which can be added together. There is thus a further reduction also in the overall dimensions. Purely by way of example, a possible timing diagram of the controllable capacitive networks 110 is given in FIG. 9, in the case where four control capacitors 120 and as many timing signals $B_0'$-$B_P'$ (P=3) are present.

Finally, it is clearly evident that modifications and variations may be made to the demodulator and to the method of demodulation described herein, without thereby departing from the scope of the present disclosure, as defined in the annexed claims. In particular, the demodulator could be of a continuous-time analog type.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A demodulator for an amplitude-modulated input signal defined by a carrier signal having a carrier frequency modulated by a modulating signal, the demodulator comprising:
    an amplifier stage having a gain and structured to receive the amplitude-modulated input signal; and
    a gain-control stage coupled to the amplifier stage and configured to vary the gain of the amplifier stage according to the carrier frequency of the carrier signal.

2. The demodulator of claim 1 wherein the amplifier stage comprises a negative-feedback operational amplifier and controllable capacitive networks coupled to inputs of the operational amplifier and having variable capacitance.

3. The demodulator of claim 2 wherein the gain-control stage is coupled to the controllable capacitive networks for modifying the variable capacitance with a periodic signal equal to the carrier frequency.

4. The demodulator of claim 3 wherein the gain-control stage is configured to modify the variable capacitance of the controllable capacitive networks according to a discrete sinusoid.

5. The demodulator of claim 3 wherein the gain-control stage is configured to execute an integer number of control cycles of the gain in each cycle of the carrier signal and to select a respective value of the variable capacitance of the controllable capacitive networks in each control cycle of the gain.

6. The demodulator of claim 5 wherein the controllable capacitive networks each comprise a plurality of respective control capacitors that are each selectively connectable to the inputs of the operational amplifier.

7. The demodulator of claim 6 wherein the gain-control stage is configured to connect a single control capacitor to each input of the operational amplifier.

8. The demodulator of claim 6 wherein the gain-control stage is configured to connect in parallel a plurality of control capacitors to each input of the operational amplifier at least in a control cycle of the gain.

9. The demodulator of claim 1 wherein the gain-control stage comprises a sign-inverting circuit cascaded to the amplifier stage and having a first input, a second input, a first output, and a second output and wherein, in a first operating configuration, the first input and the second input are connected to the first output and to the second output, respectively, and, in a second operating configuration, the first input and the second input are connected to the second output and to the first output, respectively.

10. The demodulator of claim 9 wherein the gain-control stage controls the sign-inverting circuit in the first operating configuration in a first half-period of the carrier signal and in the second operating configuration in a second half-period of the carrier signal.

11. The demodulator of claim 1, comprising outputs wherein the gain-control stage comprises a zero circuit cascaded to the amplifier stage and controlled so as to couple the amplifier stage to the outputs in a first operating configuration and uncouple the amplifier stage from the outputs in a second operating configuration.

12. The demodulator of claim 1 wherein the amplifier stage comprises an offset-sampling circuit structured to store an offset of the operational amplifier in a first step of operation, and a feedback circuit configured to erase the offset in a second step of operation.

13. A method for demodulation of a signal, comprising:
receiving an amplitude-modulated input signal, defined by a carrier signal at a carrier frequency and a modulating signal; and
amplifying the input signal with a gain that is varied according to the carrier frequency of the carrier signal.

14. The method of claim 13 wherein the step of varying the gain comprises executing an integer number of control cycles of the gain in each cycle of the carrier signal.

15. The method of claim 14 wherein the step of varying the gain comprises:
modifying a variable capacitance of a capacitive network defining the gain at each control cycle of the gain; and
inverting a sign of the gain at each half-period of the carrier signal.

16. The method of claim 14 wherein the step of modifying comprises selecting a capacitor from amongst a plurality of capacitors at each control cycle of the gain.

17. The method of claim 16 wherein the step of modifying comprises selecting a plurality of capacitors in parallel in at least one control cycle of the gain.

18. A circuit, comprising:
a variable gain amplifier stage adapted to receive an amplitude modulated signal and to generate an output signal having a gain; and
a gain control stage coupled to the variable gain amplifier stage, the gain control stage adapted to receive as input a carrier signal of the amplitude modulated signal and to generate a gain control signal to control the gain of the variable gain amplifier stage in response to a frequency of the carrier signal and to bring the amplitude modulated signal into a baseband in the output signal.

19. The circuit of claim 18 wherein the gain control stage varies the gain of the variable gain amplifier stage according to a zero-mean discrete sinusoid at the carrier frequency of the carrier signal, and the gain control signal is applied to the amplitude modulated signal to demodulate the amplitude modulated signal into the baseband.

20. The circuit of claim 19 wherein the gain control stage is adapted to generate timing signals that are applied to a controllable capacitance network circuit in the variable gain amplifier stage to select values of a variable capacitance according to a periodic signal having a frequency equal to the carrier frequency in which the values of the variable capacitance are given by:

$$C_V(J) = C_{FB} \sin(2\pi t_J / T_{CK}) \quad (2)$$

where $t_J$ is an initial instant of a J-th control cycle of the gain, $C_{FB}$ is the feedback capacitance, and $T_{CK}$ is the period of the timing signals.

21. The circuit of claim 19 wherein the variable gain amplifier stage comprises a negative feedback operational amplifier, and a controllable capacitive network comprising the variable capacitance is coupled to inputs of the operational amplifier, and wherein the gain control stage is coupled to the controllable capacitive network and is configured to execute an integer number of control cycles of the gain in each cycle of the carrier signal and to select a respective value of the variable capacitance of the controllable capacitive network circuit, the controllable capacitive network circuit comprising controllable capacitive networks having a plurality of respective control capacitors selectively connectable to inputs of the operational amplifier, wherein the gain control stage is configured to connect in parallel a plurality of control capacitors to each input of the operational amplifier at least in a control cycle of the gain.

22. A gyroscopic apparatus, comprising:
a gyroscope device generating a modulated signal, the gyroscope device comprising two microstructure movable masses and a read interface, the modulated signal comprising a discrete-time analog voltage given by a product of a modulating signal and a carrier signal having a carrier frequency, the carrier frequency comprising a mechanical resonance frequency of the two movable masses and an amplitude modulation that is proportional to an angular velocity of the gyroscope device; and
a demodulator of the discrete-time analog type, the demodulator comprising:
a variable gain amplifier stage adapted to receive an amplitude modulated signal and to generate an output signal having a gain; and
a gain control stage coupled to the variable gain amplifier stage, the gain control stage adapted to receive as input a carrier signal of the amplitude modulated signal and to generate a gain control signal to control the gain of the variable gain amplifier stage in response to a frequency of the carrier signal and to bring the amplitude modulated signal into a baseband in the output signal.

23. The apparatus of claim 22, wherein the demodulator comprises:
a sign-inverting circuit cascaded to the amplifier stage and having a first input, a second input, a first output, and a second output and wherein, in a first operating configuration, the first input and the second input are connected to the first output and to the second output, respectively, and, in a second operating configuration, the first input and the second input are connected to the second output and to the first output, respectively.

24. The apparatus of claim 22 wherein the gain control stage is structured to vary the gain of the variable gain amplifier stage according to a zero-mean discrete sinusoid at the frequency of the carrier signal, and the gain control signal is used as a demodulating quantity applied to the amplitude modulated signal to demodulate the amplitude modulated signal into the baseband.

25. The apparatus of claim 24 wherein the gain control stage is structured to generate timing signals that are applied to a controllable capacitance network circuit in the variable gain amplifier stage to select values of a variable capacitance according to a signal having a frequency equal to the carrier frequency in which the values of the variable capacitance are given by:

$$C_V(J) = C_{FB} \sin(2\pi t_J / T_{CK}) \qquad (2)$$

where $t_J$ is an initial instant of a J-th control cycle of the gain, $C_{FB}$ is the feedback capacitance, and $T_{CK}$ is the period of the timing signals.

26. The apparatus of claim 24 wherein the variable gain amplifier stage comprises a negative feedback operational amplifier and the controllable capacitive network coupled to inputs of the operational amplifier and having the variable capacitance, and wherein the gain control stage is coupled to the controllable capacitive networks and is configured to execute an integer number of control cycles of the gain in each cycle of the carrier signal and for selecting a respective value of the variable capacitance of the controllable capacitive network circuit, the controllable capacitive network circuit comprising controllable capacitive networks having a plurality of respective control capacitors selectively connectable to inputs of the operational amplifier, wherein the gain control stage is configured to connect in parallel a plurality of control capacitors to each input of the operational amplifier at least in a control cycle of the gain.

\* \* \* \* \*